United States Patent
Takasu et al.

(10) Patent No.: US 12,235,397 B2
(45) Date of Patent: Feb. 25, 2025

(54) RADIATION DETECTOR

(71) Applicant: KABUSHIKI KAISHA TOSHIBA, Tokyo (JP)

(72) Inventors: Isao Takasu, Setagaya (JP); Atsushi Wada, Kawasaki (JP); Fumihiko Aiga, Kawasaki (JP); Kohei Nakayama, Kawasaki (JP); Yuko Nomura, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 833 days.

(21) Appl. No.: 17/460,942

(22) Filed: Aug. 30, 2021

(65) Prior Publication Data

US 2022/0140244 A1 May 5, 2022

(30) Foreign Application Priority Data

Nov. 5, 2020 (JP) ................... 2020-185114

(51) Int. Cl.
*G01T 1/24* (2006.01)
*G01T 1/20* (2006.01)
(Continued)

(52) U.S. Cl.
CPC .............. *G01T 1/24* (2013.01); *G01T 1/2018* (2013.01); *G01T 1/2033* (2013.01); *H10K 30/30* (2023.02);
(Continued)

(58) Field of Classification Search
None
See application file for complete search history.

(56) References Cited

U.S. PATENT DOCUMENTS 7,435,975 B2 * 10/2008 Shoji ...................... G01T 1/202
250/370.11
8,274,056 B2 * 9/2012 Akers .................... G01T 1/2008
250/367
(Continued)

FOREIGN PATENT DOCUMENTS

JP       H04204079 A  *  7/1992
JP       2018-85387 A     5/2018
(Continued)

OTHER PUBLICATIONS

English translation for JP H04-204079 A (Year: 1992).*
(Continued)

*Primary Examiner* — Thomas R Artman
(74) *Attorney, Agent, or Firm* — Oblon, McClelland, Maier & Neustadt, L.L.P.

(57) ABSTRACT

According to one embodiment, a radiation detector includes a first layer, a first conductive layer, a second conductive layer, and an organic semiconductor layer. The first layer includes a first organic substance. The first layer emits light based on beta rays incident on the first layer. A period from a time of a maximum value of an intensity of the light until the intensity of the light drops to 1/2.72 of the maximum value is not less than 10 ns. The second conductive layer is located between the first layer and the first conductive layer. The organic semiconductor layer is located between the first conductive layer and the second conductive layer.

5 Claims, 7 Drawing Sheets

(51) Int. Cl.
  *G01T 1/203* (2006.01)
  *H10K 30/30* (2023.01)
  *H10K 85/10* (2023.01)
  *H10K 85/20* (2023.01)
  *C09K 11/06* (2006.01)
  *H10K 39/00* (2023.01)
  *H10K 39/32* (2023.01)

(52) U.S. Cl.
  CPC ......... *H10K 85/113* (2023.02); *H10K 85/215* (2023.02); *C09K 11/06* (2013.01); *H10K 39/32* (2023.02); *H10K 39/501* (2023.02)

(56) References Cited

U.S. PATENT DOCUMENTS

| | | | |
|---|---|---|---|
| 9,321,957 B2 | 4/2016 | Menge | |
| 10,186,555 B2* | 1/2019 | Takasu | G01T 1/24 |
| 10,193,093 B2* | 1/2019 | Takasu | G01T 1/242 |
| 10,209,371 B2* | 2/2019 | Takasu | G01T 1/203 |
| 10,295,681 B2* | 5/2019 | Taguchi | G01T 3/06 |
| 10,302,775 B2* | 5/2019 | Kobayashi | G01T 1/2008 |
| 10,446,771 B2* | 10/2019 | Jung | H10K 85/30 |
| 11,152,575 B2* | 10/2021 | Wada | G01T 1/208 |
| 11,226,421 B2* | 1/2022 | Aiga | G01T 1/242 |
| 11,947,057 B2* | 4/2024 | Takasu | C07F 5/022 |
| 2007/0075254 A1* | 4/2007 | Shoji | G01T 1/202 250/361 R |
| 2011/0163237 A1 | 7/2011 | Akers et al. | |
| 2015/0076360 A1* | 3/2015 | Menge | G01T 1/203 250/483.1 |
| 2018/0143329 A1 | 5/2018 | Takasu et al. | |
| 2018/0156930 A1* | 6/2018 | Taguchi | G01T 3/06 |
| 2018/0277607 A1* | 9/2018 | Takasu | G01T 1/24 |
| 2018/0277779 A1* | 9/2018 | Takasu | H10K 30/35 |
| 2019/0056515 A1 | 2/2019 | Kobayashi et al. | |
| 2019/0148659 A1* | 5/2019 | Jung | H10K 39/36 257/40 |
| 2019/0173018 A1* | 6/2019 | Wada | G01T 1/208 |
| 2020/0408937 A1* | 12/2020 | Hamel | G01T 1/2042 |
| 2021/0055435 A1 | 2/2021 | Aiga et al. | |
| 2022/0140244 A1* | 5/2022 | Takasu | G01T 1/24 257/40 |
| 2022/0259491 A1* | 8/2022 | Wada | G01T 1/2033 |
| 2023/0288581 A1* | 9/2023 | Takasu | C07F 5/022 |

FOREIGN PATENT DOCUMENTS

| | | |
|---|---|---|
| JP | 2019-35703 A | 3/2019 |
| JP | 2020-37523 A | 3/2020 |
| JP | 2021-34447 A | 3/2021 |
| WO | WO 2015/129069 A1 | 9/2015 |

OTHER PUBLICATIONS

Hajagos, T. et al. "Plastic scintillators based on thermally activated delayed fluorescence dyes" Nuclear Inst. and Methods in Physics Research, A 940, (2019), 14 pages.

* cited by examiner

RADIATION DETECTOR

CROSS-REFERENCE TO RELATED APPLICATIONS

This application is based upon and claims the benefit of priority from Japanese Patent Application No. 2020-185114, filed on Nov. 5, 2020; the entire contents of which are incorporated herein by reference.

FIELD

Embodiments described herein relate generally to a radiation detector.

BACKGROUND

For example, there is a radiation detector that uses an organic semiconductor material. It is desirable to increase the detection accuracy of the radiation detector.

DETAILED DESCRIPTION

According to one embodiment, a radiation detector includes a first layer, a first conductive layer, a second conductive layer, and an organic semiconductor layer. The first layer includes a first organic substance. The first layer emits light based on beta rays incident on the first layer. A period from a time of a maximum value of an intensity of the light until the intensity of the light drops to 1/2.72 of the maximum value is not less than 10 ns. The second conductive layer is located between the first layer and the first conductive layer. The organic semiconductor layer is located between the first conductive layer and the second conductive layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
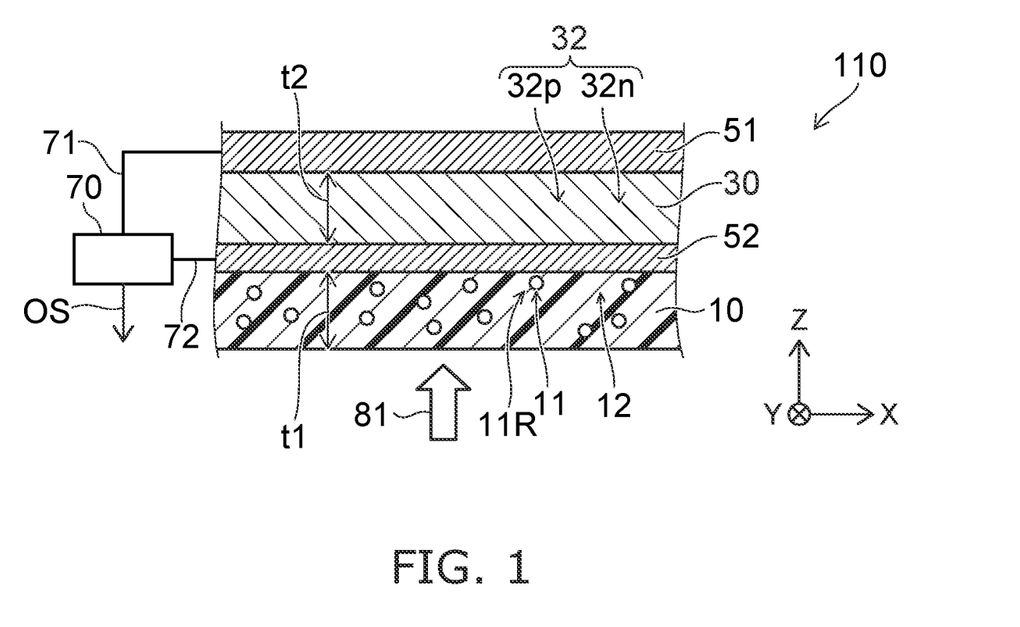
FIG. 1 is a schematic cross-sectional view illustrating a radiation detector according to a first embodiment.

FIG. 1 is a schematic cross-sectional view illustrating a radiation detector according to a first embodiment.

FIGS. 2A and 2B and FIGS. 3 to 5 are schematic views illustrating portions of the radiation detector according to the first embodiment.

As shown in FIG. 1, the radiation detector 110 according to the embodiment includes a first layer 10, a first conductive layer 51, a second conductive layer 52, and an organic semiconductor layer 30.

The second conductive layer 52 is located between the first layer 10 and the first conductive layer 51. The organic semiconductor layer 30 is located between the first conductive layer 51 and the second conductive layer 52.

The first layer 10 includes a first organic substance 11. The first layer 10 may further include a second organic substance 12. The second organic substance 12 is light-transmissive. The transmittance of the second organic substance 12 for light of wavelengths of visible light is, for example, not less than 85%. As shown in FIG. 1, the first layer 10 may include multiple regions 11R that include the first organic substance 11. The second organic substance 12 is around the multiple regions 11R.

Figure 3:
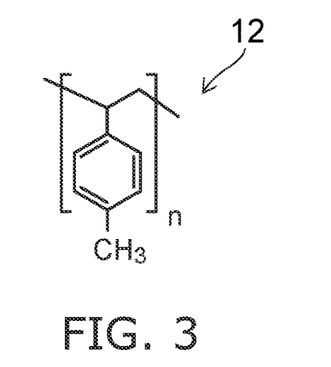
FIG. 3 is a schematic view illustrating a portion of the radiation detector according to the first embodiment.

The second organic substance 12 may include, for example, the polyvinyl toluene illustrated in FIG. 3, etc. The second organic substance 12 includes, for example, at least one selected from the group consisting of polyvinyl toluene, polyvinyl carbazole, and polymethyl methacrylate.

According to the embodiment, the concentration of the first organic substance 11 in the first layer 10 is, for example, not less than 0.05 wt % and not more than 40 wt %.

Figure 2A:
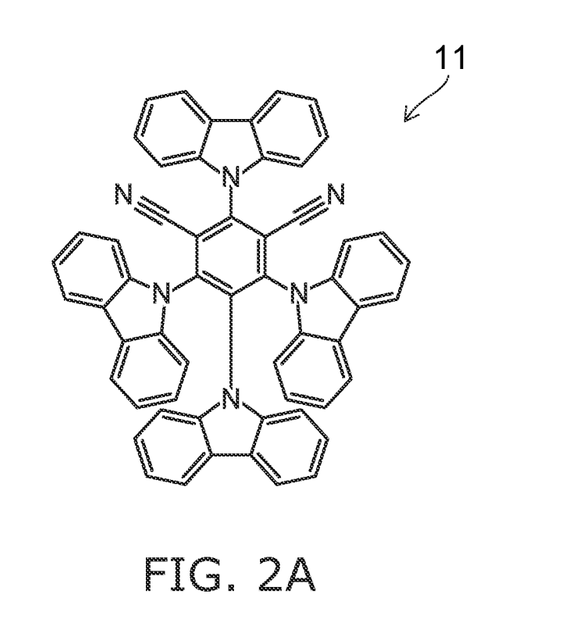
FIGS. 2A and 2B are schematic views illustrating portions of the radiation detector according to the first embodiment.
Figure 2B:
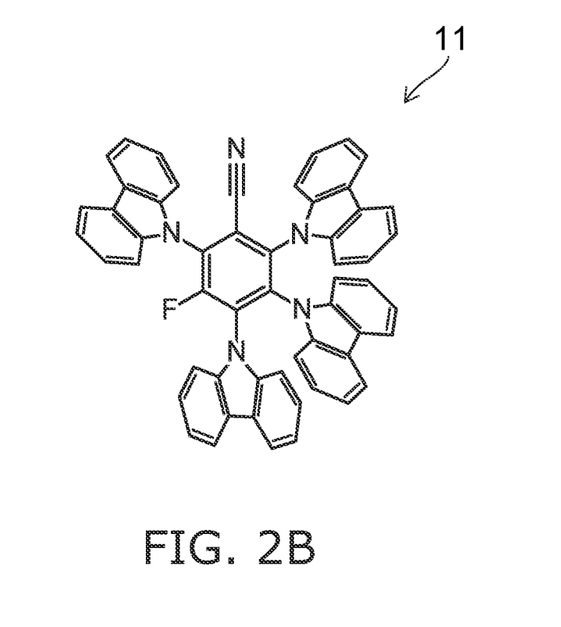

FIG. 2A shows an example of the first organic substance 11. In the example, the first organic substance 11 includes 2,4,5,6-tetra(9H-carbazole-9-yl)-5-fluorobenzonitrile. FIG. 2B shows another example of the first organic substance 11. In the example, the first organic substance 11 includes 2,4,5,6-tetra(9H-carbazole-9-yl)isophthalonitrile. As described below, the first organic substance 11 may include a thermally activated delayed fluorescence material. For example, the difference between the energy of the excited triplet state of the first organic substance 11 and the energy of the excited singlet state of the first organic substance 11 is not more than 500 meV. The emission lifetime of such a first organic substance 11 is long.

As shown in FIG. 1, the organic semiconductor layer 30 includes a p-type region $32p$ and an n-type region $32n$. The p-type region $32p$ and the n-type region $32n$ are included in an organic semiconductor 32.

Figure 4:
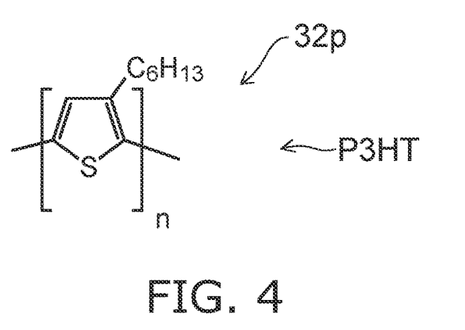
FIG. 4 is a schematic view illustrating a portion of the radiation detector according to the first embodiment.

FIG. 4 illustrates the p-type region $32p$. In the example, the p-type region $32p$ includes P3HT (poly(3-hexylthiophene)).

Figure 5:
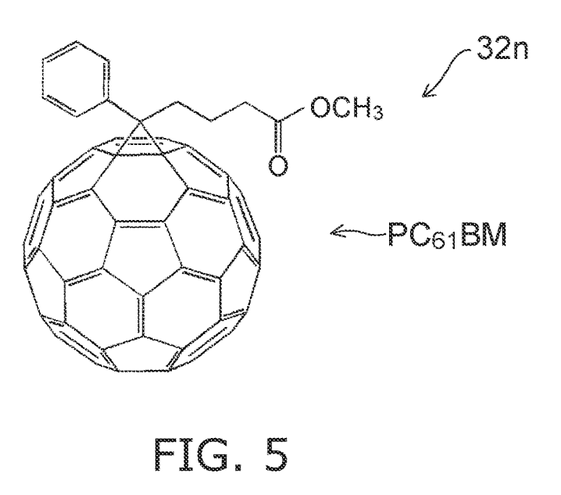
FIG. 5 is a schematic view illustrating a portion of the radiation detector according to the first embodiment.

FIG. 5 includes the n-type region $32n$. For example, the n-type region $32n$ includes a fullerene derivative. In the example, the n-type region $32n$ includes $PC_{61}BM$ ([6,6]- phenyl-$C_{61}$-butyric acid methyl ester). Thus, for example, the organic semiconductor layer 30 includes polythiophene and a fullerene derivative.

As shown in FIG. 1, a first direction from the second conductive layer 52 toward the first conductive layer 51 is taken as a Z-axis direction. One direction perpendicular to the Z-axis direction is taken as an X-axis direction. A direction perpendicular to the Z-axis direction and the X-axis direction is taken as a Y-axis direction. The first direction is the stacking direction.

For example, the first conductive layer 51, the second conductive layer 52, and the organic semiconductor layer 30 spread along the X-Y plane. The first layer 10 spreads along the X-Y plane.

As shown in FIG. 1, the first layer 10 has a thickness (a first thickness t1) along the Z-axis direction. According to the embodiment as described below, it is favorable for the first thickness t1 to be not less than 50 μm and not more than 5000 μm. For example, a high detection accuracy is obtained.

As shown in FIG. 1, the organic semiconductor layer 30 has a thickness (a second thickness t2) along the Z-axis direction. According to the embodiment as described below, it is favorable for the second thickness t2 to be not less than 500 nm and not more than 50 μm. For example, a high detection accuracy is obtained.

A detection circuit 70 is included in the example. The detection circuit 70 is electrically connected with the first and second conductive layers 51 and 52. For example, the detection circuit 70 is electrically connected with the first conductive layer 51 by a first wiring 71. For example, the detection circuit 70 is electrically connected with the second conductive layer 52 by a second wiring 72. The detection circuit 70 outputs a signal OS that corresponds to the intensity of radiation 81 incident on the first layer 10.

The radiation 81 includes, for example, beta rays. The radiation 81 may include, for example, gamma rays. For example, the radiation 81 enters from the first layer 10 side.

When the radiation 81 enters the first layer 10, light is generated in the first layer 10. The generated light passes through the second conductive layer 52 and enters the organic semiconductor layer 30. Based on the light that enters, the organic semiconductor layer 30 generates a movable charge. A voltage is applied between the first conductive layer 51 and the second conductive layer 52 by the detection circuit 70. Thereby, the generated charge moves toward the first conductive layer 51 or the second conductive layer 52. The moved charge is detected by the detection circuit 70. The radiation 81 of the detection object can be detected thereby. For example, the organic semiconductor layer 30 functions as a photoelectric conversion layer.

For example, the first layer 10 functions as a scintillator. The first layer 10 is not an inorganic scintillator.

In a first reference example that uses an inorganic scintillator, light is generated not only when beta rays are incident but also when gamma rays are incident. Therefore, when the first reference example is used in an application of detecting by separating beta rays from gamma rays, it is difficult to detect beta rays with high accuracy due to the effects of gamma rays.

According to the embodiment, the first layer 10 is a layer of an organic material. If the first layer 10 is not excessively thick, the gamma rays substantially pass through the first layer 10 when the gamma rays are incident on the first layer 10. The light that is caused by the gamma rays is faint in the first layer 10. Therefore, the first layer 10 is substantially not sensitive to gamma rays. The effects of gamma rays can be suppressed in the detection of beta rays.

A second reference example uses an organic scintillator that does not include the first organic substance 11. In the second reference example as well, gamma rays pass through the first layer 10 if the organic scintillator is not excessively thick. Therefore, in the second reference example as well, the effects of gamma rays can be suppressed in the detection of beta rays. However, the sensitivity to beta rays is low in the second reference example that does not include the first organic substance 11. In other words, in the second reference example, the sensitivity is low for both gamma rays and beta rays when the organic scintillator is not excessively thick. If the organic scintillator is made thick, the sensitivity to gamma rays undesirably increases with the sensitivity to beta rays. Therefore, in the second reference example, it is difficult to detect beta rays with high accuracy while suppressing the effects of gamma rays.

Conversely, according to the embodiment, the first layer 10 that functions as a scintillator includes the first organic substance 11. The gamma rays that are incident on the first layer 10 substantially pass through the first layer 10. Light is efficiently generated from the first organic substance 11 based on the beta rays that are incident on the first layer 10. The light is, for example, fluorescence. The intensity of the light is high. Light of a high intensity passes through the second conductive layer 52 and is incident on the organic semiconductor layer 30. In the organic semiconductor layer 30, the light of the high intensity is converted into a charge; and the signal OS of a high intensity is obtained.

According to the embodiment, for example, the effects of gamma rays can be suppressed, and beta rays can be detected with high sensitivity. According to the embodiment, a radiation detector can be provided in which the detection accuracy can be increased.

It was found that according to the embodiment, when the first layer 10 includes a first organic substance 11 such as that described above, the effects of gamma rays can be suppressed, and beta rays can be detected with high sensitivity. An example of results of experiments performed by the inventor of the application will now be described.

In a first sample, the first layer 10 includes 2,4,5,6-tetra (9H-carbazole-9-yl)-5-fluorobenzonitrile and polyvinyl carbazole. The concentration of 2,4,5,6-tetra(9H-carbazole-9-yl)-5-fluorobenzonitrile in the first layer 10 is 10 wt %. The first thickness t1 of the first layer 10 is 220 μm. The organic semiconductor layer 30 includes P3HT and $PC_{61}BM$. The second thickness t2 of the organic semiconductor layer 30 is 5 μm.

In the second sample, the first layer 10 includes 2-(4-tertiary butylphenyl)-5-(4-biphenylyl)-1,3,4-oxadiazole. The first layer 10 does not include the first organic substance 11 described above. Otherwise, the conditions of the second sample are the same as those of the first sample.

Beta rays are irradiated on these samples; and the detection efficiency of the beta rays is measured. In the experiment, beta rays generated from strontium 90 are used. The detection efficiency of the beta rays of the first sample is about 15 times the detection efficiency of the beta rays of the second sample.

The radiation 81 that includes beta rays and gamma rays was irradiated on these samples; and the detection selectivity of beta rays in the radiation 81 was measured. The detection selectivity of beta rays is the ratio of the intensity of the detection signal of beta rays to the intensity of the detection signal of gamma rays. The detection selectivity of beta rays in the first sample is 2.5 times the detection selectivity of beta rays in the second sample.

Thus, it was found that because the first layer 10 includes the first organic substance 11, a high detection efficiency of beta rays is obtained. It was found that a high detection selectivity for beta rays is obtained.

In a third sample, the first layer 10 includes an inorganic scintillator. The first thickness t1 of the first layer 10 is 220 μm. Otherwise, the conditions of the third sample are the same as those of the first sample. In the third sample, the detection efficiency of beta rays was low. The detection selectivity of beta rays also was low. It is considered that this is because when the first layer 10 includes an inorganic scintillator, the first layer 10 easily absorbs gamma rays; and light is easily generated based on the gamma rays.

In a fourth sample, the first layer 10 is the same as the first layer 10 of the first sample described above. In the fourth sample, an inorganic semiconductor layer is provided instead of the organic semiconductor layer 30. The detection efficiency of beta rays was low in the fourth sample. The detection selectivity of beta rays also was low. It is considered that this is because a charge is easily generated based on gamma rays in the inorganic semiconductor layer.

Thus, in the first sample, a high detection efficiency and a high detection selectivity are obtained for beta rays. It is considered that this is because the characteristics of the light generated by the first organic substance 11 are suited to the photoelectric conversion characteristics of the organic semiconductor layer 30. The life of the light generated in the first organic substance 11 is longer than the life of the light generated in the 2-(4-tertiary butylphenyl)-5-(4-biphenylyl)-1,3,4-oxadiazole of the second sample described above.

Figure 6A:
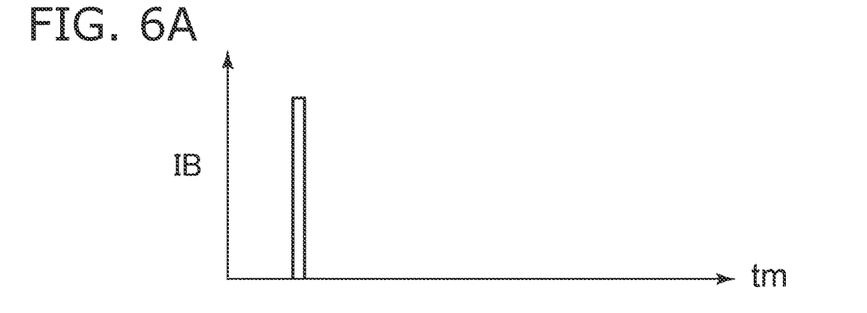
FIGS. 6A and 6B are schematic views illustrating characteristics of the radiation detector.
Figure 6B:
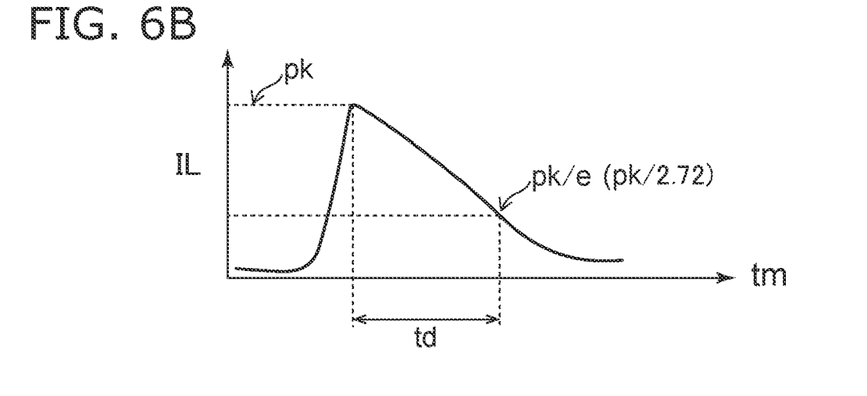

FIGS. 6A and 6B are schematic views illustrating characteristics of the radiation detector.

In these figures, the horizontal axis is a time tm. The axis of FIG. 6A is an intensity IB of beta rays. The vertical axis of FIG. 6B is an intensity IL of the light generated by an organic material when the beta rays are incident on the organic material. As shown in FIG. 6B, light is generated based on the beta rays. The intensity IL of the light has a maximum value pk. The intensity IL of the light attenuates after the maximum value pk; and there is a time at which the intensity IL becomes a value of 1/2.72 of the maximum value pk. The period after irradiating the beta rays from the time at which the intensity IL of the light becomes the maximum value pk until the intensity IL of the light drops to 1/2.72 of the maximum value pk of the intensity IL of the light is taken as an emission lifetime td. For example, "1/2.72 of the maximum value pk" corresponds to "1/e of the maximum value pk" (e being Napier's constant). Napier's constant e is the base of the natural logarithm and is about 2.71828.

The emission lifetime td is long in the first organic substance 11. For example, the emission lifetime td of the first organic substance 11 is not less than 10 ns. The emission lifetime of the organic material in the second sample is, for example, not more than 5 ns. Thus, it is considered that a long emission lifetime td of the first organic substance 11 has a relationship with obtaining a high detection efficiency and a high detection selectivity for beta rays.

According to the embodiment, the organic semiconductor layer 30 is used as a photoelectric conversion layer. The effects of gamma rays on the photoelectric conversion characteristics can be suppressed thereby. Generally, the rate (the mobility) of the movement of the charge in the organic semiconductor layer 30 is slower than the rate (the mobility) of the movement of the charge in an inorganic semiconductor layer. Therefore, when the first layer 10 has the emission lifetime td that is suited to the period necessary for the movement of the charge in the organic semiconductor layer 30, a high detection efficiency and a high detection selectivity are obtained for beta rays.

Thus, according to the embodiment, it is favorable for the period (the emission lifetime td) from the incidence of beta rays on the first layer 10 until the intensity IL of the light drops to 1/2.72 of the maximum value pk of the intensity IL of the light to be not less than 10 ns. The emission lifetime td may be not less than 100 ns. The emission lifetime td may be not less than 300 ns. When the emission lifetime td is excessively long, for example, it easily becomes difficult to separate from a signal based on another incidence of beta rays. The emission lifetime td may be, for example, not more than 100 μs. The separation is easier.

According to the embodiment, it is favorable for the first organic substance 11 to include a thermally activated delayed fluorescence material. A long emission lifetime td is easily obtained thereby. For example, the difference between the energy of the excited triplet state of the first organic substance 11 and the energy of the excited singlet state of the first organic substance 11 is not more than 500 meV. A long emission lifetime td is easily obtained thereby.

According to the embodiment, the intensity of the signal OS (referring to FIG. 1) obtained when beta rays are incident on the first layer 10 is greater than the intensity of the signal OS obtained when other radiation (gamma rays, neutron rays, X-rays, etc.) are incident on the first layer 10. For example, the sensitivity (the intensity) of the first signal generated between the first conductive layer 51 and the second conductive layer 52 when beta rays are incident on the first layer 10 is greater than the sensitivity (the intensity) of the second signal generated between the first conductive layer 51 and the second conductive layer 52 when at least one of gamma rays, neutron rays, or X-rays are incident on the first layer 10.

Figure 7:
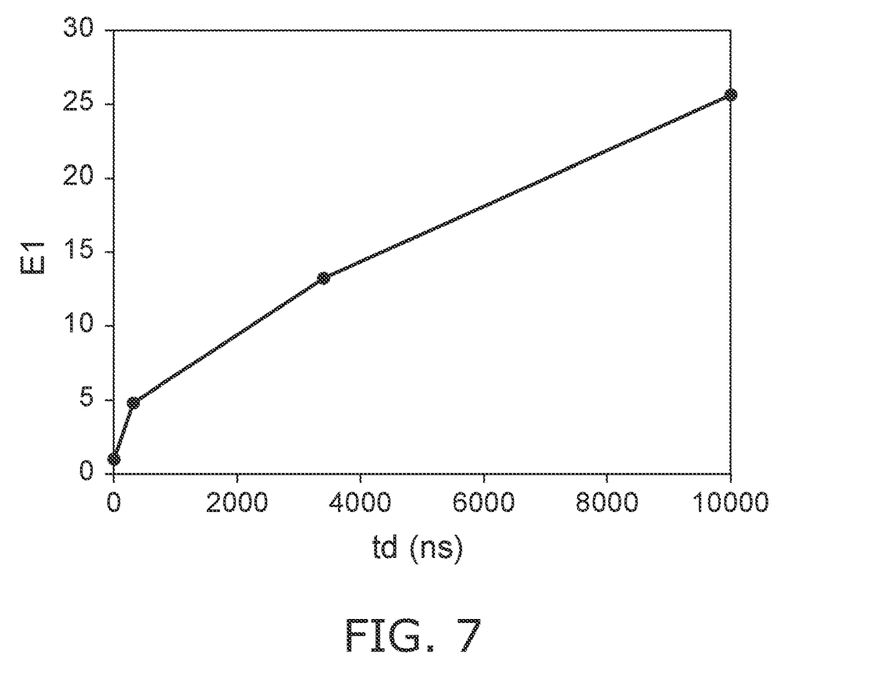
FIG. 7 is a graph illustrating characteristics of the radiation detector.

FIG. 7 is a graph illustrating characteristics of the radiation detector.

The horizontal axis of FIG. 7 is the emission lifetime td. The vertical axis is a beta ray detection efficiency E1 (a relative value). FIG. 7 illustrates an example of experiment results when different materials are used as the first layer 10. In the first sample, the first layer 10 includes 2,4,5,6-tetra (9H-carbazole-9-yl)-5-fluorobenzonitrile. In the first sample, the emission lifetime td is about 10000 ns. In the second sample, the first layer 10 includes 2-(4-tertiary butylphenyl)-5-(4-biphenylyl)-1,3,4-oxadiazole. In the second sample, the emission lifetime td is 1.4 ns. In the fifth sample, the first layer 10 includes 2,4,5,6-tetra(9H-carbazole-9-yl)isophthalonitrile. In the fifth sample, the emission lifetime td is about 3400 ns. The emission lifetime td of the sixth sample is 316 ns. In these samples, the organic semiconductor layer 30 includes P3HT and $PC_{61}BM$. The second thickness t2 of the organic semiconductor layer 30 is 5 μm.

As shown in FIG. 7, a high beta ray detection efficiency E1 is obtained when the emission lifetime td is long. According to the embodiment, it is favorable for the emission lifetime td to be not less than 10 μs. In the samples of the example of FIG. 7, the second thickness t2 of the organic semiconductor layer 30 is 5 μm. It is favorable for the ratio of the emission lifetime td to the second thickness t2 of the organic semiconductor layer 30 to be, for example, not less than 10 μs/5 μm, i.e., not less than 2 s/m.

According to the embodiment, the electrostatic capacitance between the first conductive layer 51 and the second conductive layer 52 can be reduced by setting the second thickness t2 of the organic semiconductor layer 30 to be thick. For example, the noise of a measurement system can be reduced thereby. When the second thickness t2 of the organic semiconductor layer 30 is made thick, the movement distance of the charge generated in the organic semiconductor layer 30 lengthens. For example, it is considered that a high beta ray detection efficiency E1 is obtained by increasing the emission lifetime td corresponding to the second thickness t2 of the organic semiconductor layer 30 being thick and the movement distance of the charge being long.

The mobility of the charge in an organic semiconductor is markedly low compared to an inorganic semiconductor (e.g., crystalline silicon, etc.). In the case of crystalline silicon, the transport of the charge is based on band conduction. Conversely, in an organic semiconductor, the transport of the charge is based on hopping conduction in an amorphous or polycrystalline film. The conduction mechanism difference has a relationship with the charge mobility difference. For example, in a silicon photodiode, the response time is not less than about 0.1 µs and not more than about 1 µs. Conversely, in a light detection system using an organic semiconductor, the response time is not less than about 10 µs and not more than about 100 µs. It is considered that a high beta ray detection efficiency E1 is obtained by the emission lifetime td being long due to such a long response time.

According to the embodiment, it is favorable for the second thickness t2 to be not less than 500 nm and not more than 50 µm. By setting the second thickness t2 to be not less than 500 nm, the noise can be reduced, and a high detection accuracy is obtained. By setting the second thickness t2 to be not more than 50 µm, a high detection temporal resolution is obtained in the detection of beta rays. In such a thickness range, it is favorable for the ratio of the emission lifetime td to the second thickness t2 of the organic semiconductor layer 30 to be, for example, not less than 0.1 s/m and not more than 100 s/m. A high beta ray detection efficiency E1 is obtained while obtaining low noise and a high detection temporal resolution.

According to the embodiment, it is favorable for the first layer 10 not to include a metallic element having an atomic number that is not less than 19. Or, it is favorable for the concentration of a metallic element having an atomic number not less than 19 in the first layer 10 to be not more than 10 wt %. The detection selectivity of beta rays is high due to the first layer 10 substantially not including such a metallic element.

According to the embodiment, it is favorable for the first thickness t1 of the first layer 10 to be not less than 5 times and not more than 1000 times the second thickness t2 of the organic semiconductor layer 30. For example, low noise and a high detection temporal resolution are easily obtained. A high beta ray detection efficiency E1 is obtained.

The first organic substance 11 may include, for example, at least one selected from the group consisting of 2,4,5,6-tetra(9H-carbazole-9-yl)isophthalonitrile, 2,4,6-tris(4-(9,9-methylacridan-10-yl)phenyl)-1,3,5-triazine, 10-(4-(bis(2,3,5-tetramethylphenyl)boranyl)-2,3,5-tetramethyl phenyl)-10H-phenoxazine, 2,4,6-tri(9H-carbazole-9-yl)-3,5-difluorobenzonitrile, and 9-[1,4]benzoxaborino[2,3,4-kl]phenoxaborin-7-yl-1,3,6,8-tetra methyl-9H-carbazole.

According to the embodiment, the p-type region 32p includes, for example, at least one of polythiophene or a derivative of polythiophene. For example, these compounds are conductive polymers having π-conjugated structures. For example, polythiophene and derivatives of polythiophene have excellent stereoregularity. These materials have relatively high solubility in solvents. Polythiophene and derivatives of polythiophene have a thiophene skeleton. The p-type region 32p includes, for example, at least one selected from the group consisting of polyarylthiophene, polyalkyl isothionaphthene, and polyethylene dioxythiophene. The polyarylthiophene described above includes, for example, at least one selected from the group consisting of polyalkylthiophene, poly(3-phenylthiophene), and poly(3-(p-alkylphenylthiophene)). The polyalkylthiophene includes, for example, at least one selected from the group consisting of poly(3-methylthiophene), poly(3-butylthiophene), poly(3-hexylthiophene), poly(3-octylthiophene), poly(3-decylthiophene), and poly(3-dodecylthiophene).

The polyalkyl isothionaphthene described above includes, for example, at least one selected from the group consisting of poly(3-butyl isothionaphthene), poly(3-hexyl isothionaphthene), poly(3-octyl isothionaphthene), and poly(3-decyl isothionaphthene). The p-type region 32p may include a polythiophene derivative. The polythiophene derivative includes, for example, at least one selected from the group consisting of carbazole, benzothiadiazole, and a copolymer of thiophene. The copolymer of thiophene includes, for example, poly[N-9''-hepta-decanyl-2,7-carbazole-alt-5,5-(4',7'-di-2-thien yl-2',1',3'-benzothiadiazole)] (PCDTBT). For example, a high conversion efficiency is obtained by the p-type region 32p including polythiophene and a derivative of polythiophene.

According to the embodiment, the n-type region 32n includes, for example, fullerene and a fullerene derivative. The fullerene derivative has a fullerene skeleton. Fullerene and the fullerene derivative include, for example, at least one selected from the group consisting of $C_{60}$, $C_{70}$, $C_{76}$, $C_{78}$, and $C_{84}$. The fullerene derivative includes fullerene oxide. In fullerene oxide, at least a portion of these carbon atoms of fullerenes is oxidized. In the fullerene derivative, a portion of the carbon atoms of the fullerene skeleton is modified with any functional group. Fullerene derivative may include a ring formed by such functional groups being bonded to each other. The fullerene derivative may include a fullerene-binding polymer. It is favorable for the n-type region 32n to include a fullerene derivative that includes a functional group having high affinity with a solvent. The solubility in a solvent is high for such a compound. The functional group included in the fullerene derivative may include, for example, at least one selected from the group consisting of a hydrogen atom, a hydroxide group, a halogen atom, an alkyl group, an alkenyl group, a cyano group, an aromatic hydrocarbon group, and an aromatic heterocyclic group. The halogen atom includes, for example, at least one selected from the group consisting of a fluorine atom and a chlorine atom. The alkyl group includes, for example, at least one selected from the group consisting of a methyl group and an ethyl group. The alkenyl group includes, for example, a vinyl group. The alkoxy group includes, for example, at least one selected from the group consisting of a methoxy group and an ethoxy group. The aromatic hydrocarbon group includes, for example, at least one selected from the group consisting of a phenyl group and a naphthyl group. The aromatic heterocyclic group includes, for example, at least one selected from the group consisting of a thienyl group and a pyridyl group.

The fullerene derivative may include, for example, hydrogenated fullerene. The hydrogenated fullerene includes, for example, at least one selected from the group consisting of $C_{60}H_{36}$ and $C_{70}H_{36}$. The fullerene derivative includes, for example, fullerene oxide. In the fullerene oxide, $C_{60}$ or $C_{70}$ is oxidized. The fullerene derivative may include, for example, a fullerene metal complex.

The fullerene derivative may include, for example, at least one selected from the group consisting of [6,6]-phenyl-$C_{61}$-butyric acid methyl ester (60PCBM), [6,6]-phenyl-$C_{71}$-butyric acid methyl ester (70PCBM), indene-$C_{60}$-bis-adduct (60ICBA), dihydronaphthyl-$C_{60}$-bis-adduct (60NCBA), and dihydronaphthyl-$C_{70}$-bis-adduct (70NCBA). 60PCBM is unmodified fullerene. The mobility of photo carriers is high in 60PCBM.

At least one of the p-type region 32$p$ or the n-type region 32$n$ may include, for example, at least one selected from the group consisting of a subphthalocyanine compound, a subnaphthalocyanine compound, a merocyanine compound, a squalilium compound, a phthalocyanine compound, a quinacridone compound, and a perylene compound. These materials are low molecular-weight substance compounds.

Second Embodiment

Figure 8:
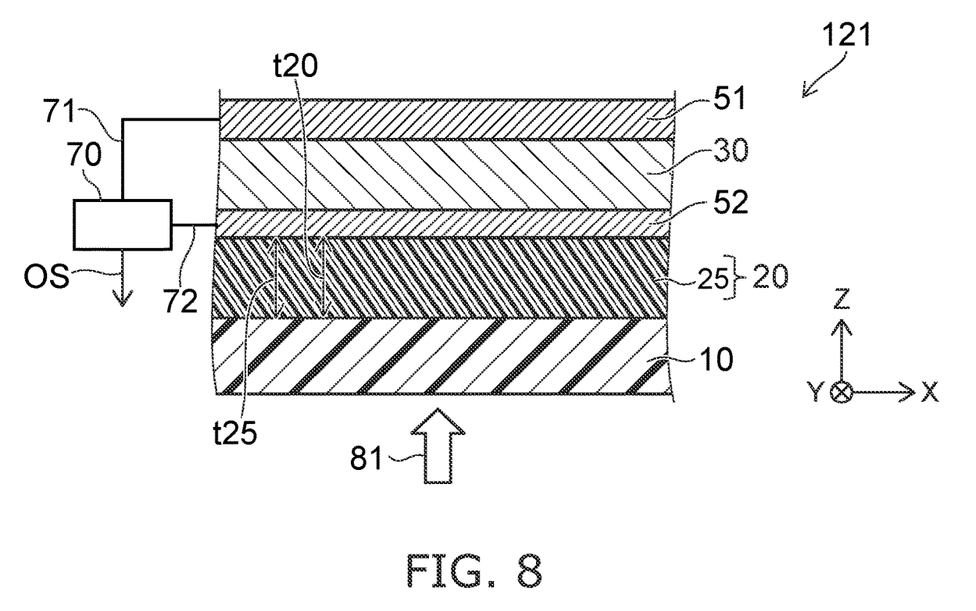
FIG. 8 is a schematic cross-sectional view illustrating a radiation detector according to a second embodiment.

FIG. 8 is a schematic cross-sectional view illustrating a radiation detector according to a second embodiment.

As shown in FIG. 8, the radiation detector 121 according to the second embodiment further includes a second layer 20 in addition to the first layer 10, the first conductive layer 51, the second conductive layer 52, and the organic semiconductor layer 30. The first layer 10, the first conductive layer 51, the second conductive layer 52, and the organic semiconductor layer 30 according to the second embodiment may be similar to the first layer 10, the first conductive layer 51, the second conductive layer 52, and the organic semiconductor layer 30 according to the first embodiment. Examples of the second layer 20 will now be described.

The second layer 20 is located between the first layer 10 and the second conductive layer 52. The second layer 20 includes an organic layer 25. The organic layer 25 includes, for example, at least one selected from the group consisting of PET, PEN, transparent polyimide, cycloolefin polymer (COP), and polycarbonate. The organic layer 25 is, for example, an organic film.

A thickness t20 of the second layer 20 is, for example, not less than 10 μm and not more than 300 μm. A thickness t25 of the organic layer 25 is, for example, not less than 10 μm and not more than 300 μm. In the example, the thickness t20 corresponds to the thickness t25.

The second layer 20 is light-transmissive. The light that is generated by the first layer 10 passes through the second layer 20 and the second conductive layer 52 and can be incident on the organic semiconductor layer 30.

By providing the second layer 20, the movement of substances included in the first layer 10 toward the second conductive layer 52 and the organic semiconductor layer 30 can be suppressed. High reliability is easily obtained.

Because the second layer 20 includes the organic layer 25, the conversion of gamma rays into light by the second layer 20 can be suppressed even when gamma rays are incident. Beta rays can be detected with high accuracy while suppressing the effects of gamma rays. For example, the second layer 20 functions as a base body. The mechanical strength of the radiation detector 121 is increased by the second layer 20.

Figure 9:
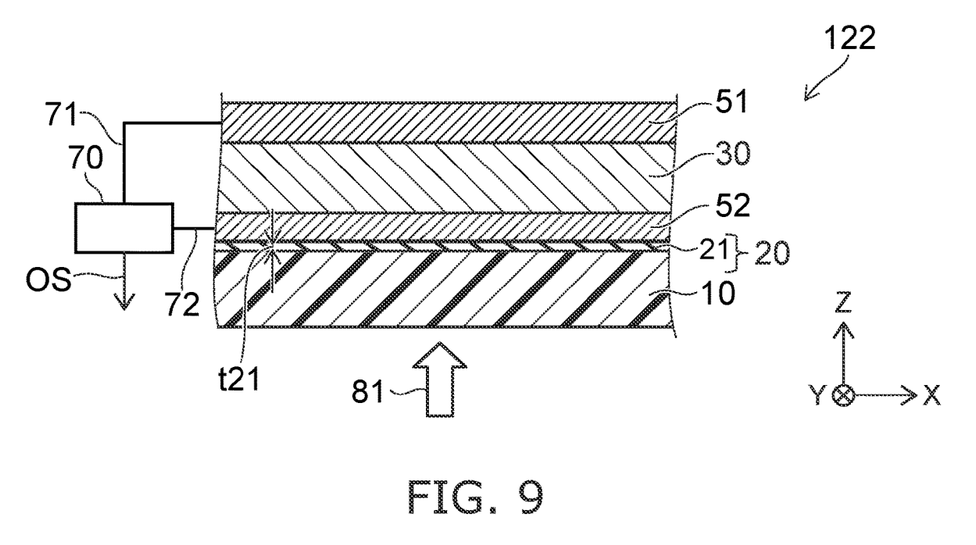
FIG. 9 is a schematic cross-sectional view illustrating a radiation detector according to the second embodiment.

FIG. 9 is a schematic cross-sectional view illustrating a radiation detector according to the second embodiment.

As shown in FIG. 9, the radiation detector 122 according to the second embodiment also includes the first layer 10, the first conductive layer 51, the second conductive layer 52, the organic semiconductor layer 30, and the second layer 20. In the radiation detector 122, the second layer 20 includes a first intermediate layer 21. The first intermediate layer 21 includes, for example, silicon oxynitride. The first intermediate layer 21 may include silicon oxide, silicon nitride, aluminum oxide, etc. For example, good barrier properties are obtained due to the first intermediate layer 21. For example, the movement of substances included in the first layer 10 toward the second conductive layer 52 and the organic semiconductor layer 30 can be suppressed. High reliability is easily obtained.

It is favorable for a thickness t21 of the first intermediate layer 21 to be thin. When the thickness t21 is excessively thick, gamma rays may be converted into light by the first intermediate layer 21 when gamma rays are incident. By setting the thickness t21 to be thin, the effects of gamma rays can be suppressed. The thickness t21 is, for example, not more than 2 μm.

Figure 10:
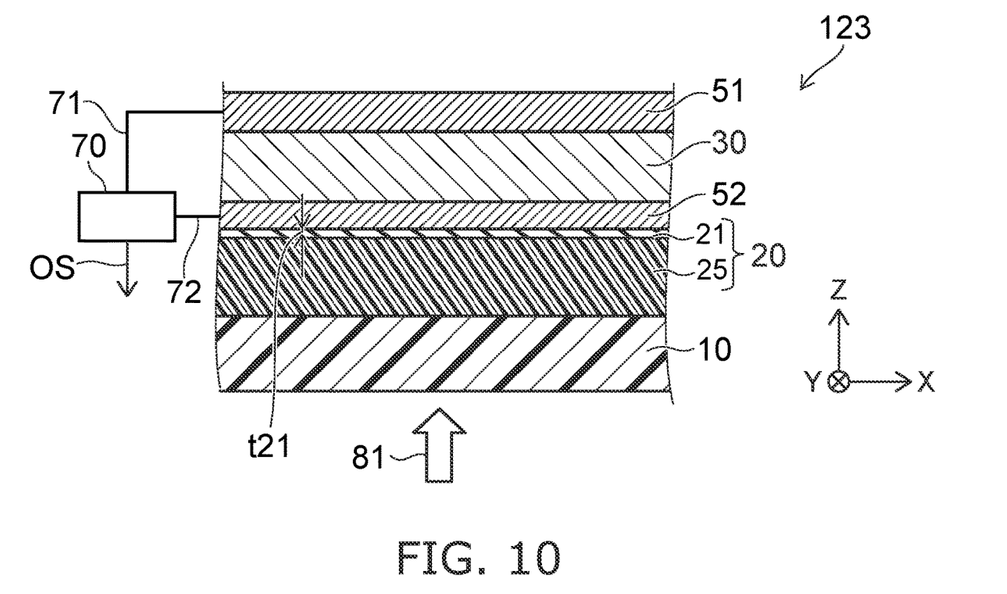
FIG. 10 is a schematic cross-sectional view illustrating a radiation detector according to the second embodiment.
Figure 11:
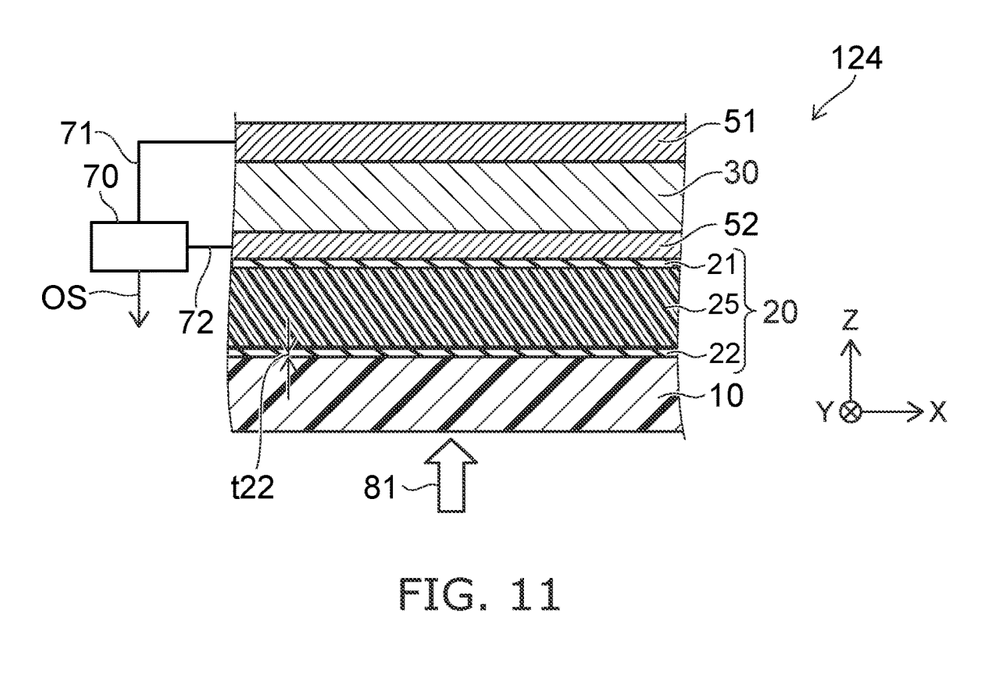
FIG. 11 is a schematic cross-sectional view illustrating a radiation detector according to the second embodiment.

FIGS. 10 and 11 are schematic cross-sectional views illustrating radiation detectors according to the second embodiment.

In a radiation detector 123 according to the second embodiment as shown in FIG. 10, the second layer 20 includes the organic layer 25 and the first intermediate layer 21. In a radiation detector 124 according to the second embodiment as shown in FIG. 11, the second layer 20 includes the organic layer 25, the first intermediate layer 21, and a second intermediate layer 22. The second layer 20 may include at least one of the first intermediate layer 21 or the second intermediate layer 22.

The first intermediate layer 21 is located between the organic layer 25 and the second conductive layer 52. The first intermediate layer 21 includes a first element that includes at least one of silicon or aluminum. The second intermediate layer 22 is located between the first layer 10 and the organic layer 25. The second intermediate layer 22 includes a second element that includes at least one of silicon or aluminum. The first intermediate layer 21 includes, for example, the first element described above and at least one of oxygen or nitrogen. The first intermediate layer 21 includes, for example, silicon oxynitride. The second intermediate layer 22 includes the second element described above and at least one of oxygen or nitrogen. The second intermediate layer 22 includes, for example, silicon oxynitride.

The thickness t21 of the first intermediate layer 21 (referring to FIG. 10) is not less than 1/600 times and not more than 1/5 times the thickness t25 of the organic layer 25 (referring to FIG. 8). A thickness t22 of the second intermediate layer 22 is not less than 1/600 times and not more than 1/5 times the thickness t25 of the organic layer 25. By setting the thicknesses of these intermediate layers to be thin, beta rays can be detected with high accuracy while suppressing the effects of gamma rays.

For example, good barrier properties are obtained due to at least one of the first intermediate layer 21 or the second intermediate layer 22. For example, the movement of substances included in the first layer 10 toward the second conductive layer 52 and the organic semiconductor layer 30 can be suppressed. High reliability is easily obtained.

Third Embodiment

Figure 12:
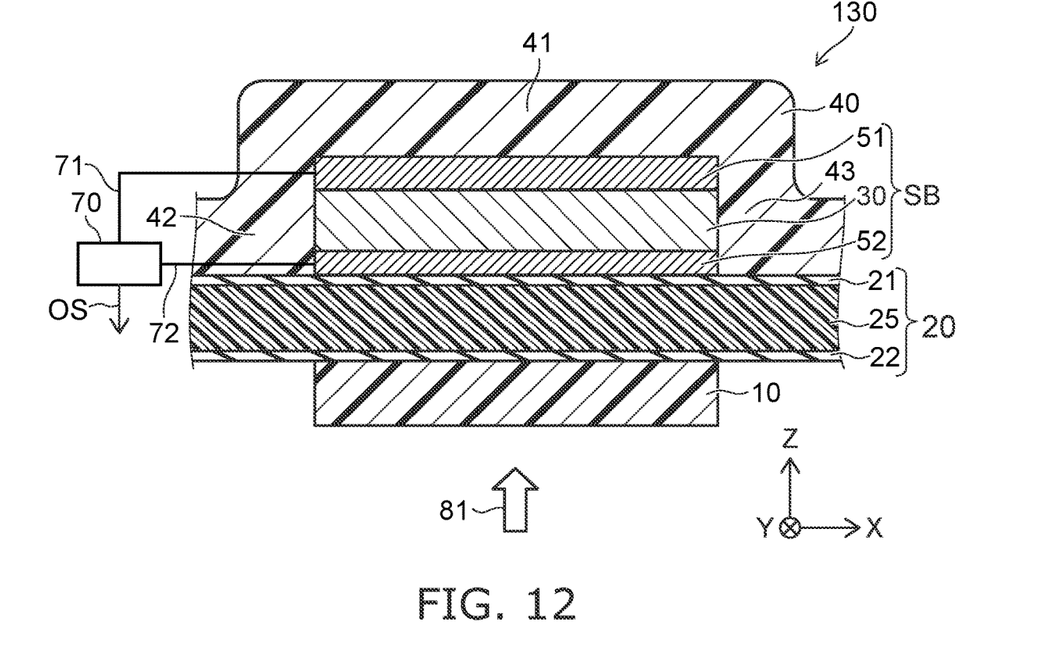
FIG. 12 is a schematic cross-sectional view illustrating a radiation detector according to a third embodiment.

FIG. 12 is a schematic cross-sectional view illustrating a radiation detector according to a third embodiment.

As shown in FIG. 12, the radiation detector 130 according to the third embodiment includes a structure body 40 in addition to the first layer 10, the first conductive layer 51, the second conductive layer 52, the organic semiconductor layer 30, and the second layer 20. The configurations described in reference to the first and second embodiments are applicable to the first layer 10, the first conductive layer 51, the second conductive layer 52, the organic semiconductor layer 30, and the second layer 20 of the radiation detector 130. In the example, the second layer 20 includes the organic layer 25, the first intermediate layer 21, and the second intermediate layer 22. In the radiation detector 130, the second layer 20 may include at least one of the first intermediate layer 21 or the second intermediate layer 22. An example of the structure body 40 will now be described.

The structure body 40 includes a first partial region 41, a second partial region 42, and a third partial region 43. The second layer 20 is between the first layer 10 and the first partial region 41 in the first direction (e.g., the Z-axis direction). The first conductive layer 51, the second conductive layer 52, and the organic semiconductor layer 30 are between the second layer 20 and the first partial region 41 in the first direction. Thus, a stacked body SB that includes the first conductive layer 51, the second conductive layer 52, and the organic semiconductor layer 30 is located between the second layer 20 and the first partial region 41.

The stacked body SB (the first conductive layer 51, the second conductive layer 52, and the organic semiconductor layer 30) is between the second partial region 42 and the third partial region 43 in a second direction that crosses the first direction. The second direction is any direction that crosses the first direction (the Z-axis direction). In the example, the second direction is the X-axis direction. For example, the second partial region 42 and the third partial region 43 are located around the stacked body SB in the X-Y plane (in a plane crossing the first direction). For example, the second partial region 42 and the third partial region 43 surround the stacked body SB in the X-Y plane. The second partial region 42 and the third partial region 43 are bonded with the second layer 20. For example, the second partial region 42 and the third partial region 43 may be directly bonded with the second layer 20. For example, the second partial region 42 and the third partial region 43 may be bonded with the second layer 20 via an adhesive layer, etc.

For example, the organic semiconductor layer 30 is sealed with the second layer 20 and the structure body 40. For example, the second layer 20 and the structure body 40 function as sealing parts. High reliability is obtained due to the second layer 20 and the structure body 40.

Fourth Embodiment

Figure 13:
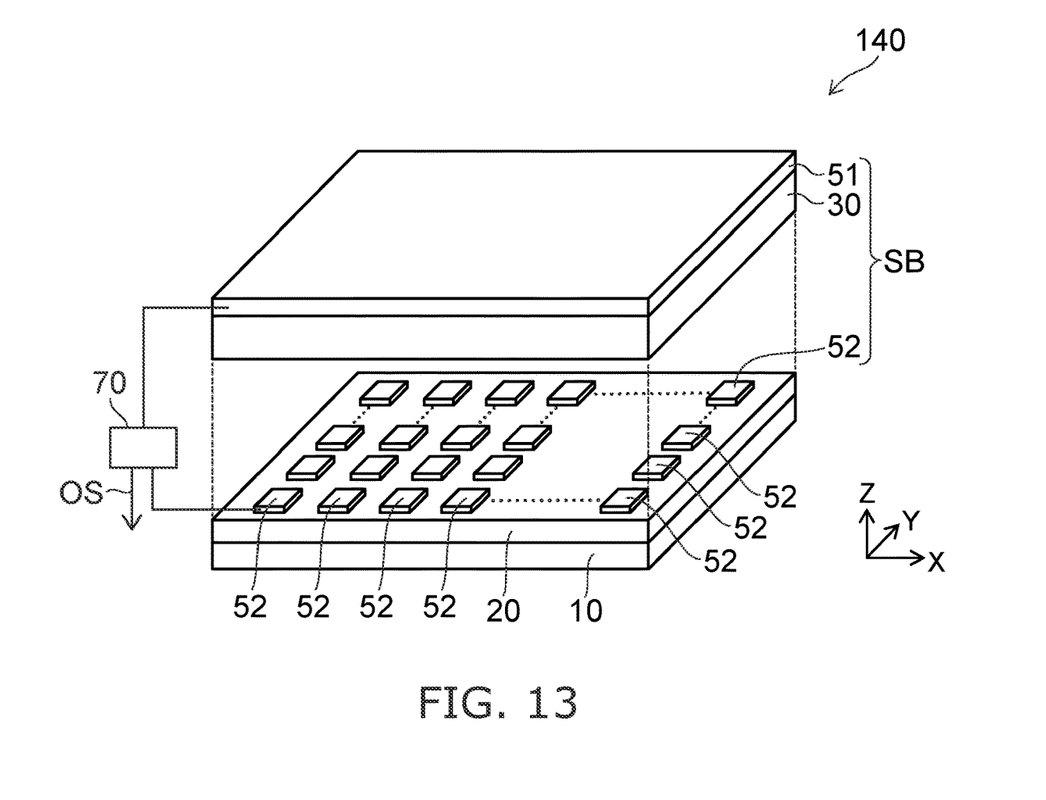
FIG. 13 is a schematic perspective view illustrating a radiation detector according to a fourth embodiment.

FIG. 13 is a schematic perspective view illustrating a radiation detector according to a fourth embodiment.

As shown in FIG. 13, the radiation detector 140 according to the fourth embodiment includes the first layer 10, the first conductive layer 51, the second conductive layer 52, the organic semiconductor layer 30, and the second layer 20. The radiation detector 140 may include the structure body 40. In FIG. 13, portions of the components included in the radiation detector 140 are drawn as being separated from each other for easier viewing of the drawing.

The radiation detector 140 includes multiple second conductive layers 52. The multiple second conductive layers 52 are arranged along a plane (e.g., the X-Y plane) that crosses the Z-axis direction. For example, the multiple second conductive layers 52 are arranged in a matrix configuration along the X-axis direction and the Y-axis direction. In the example, the first conductive layer 51 and the organic semiconductor layer 30 are continuous.

According to the embodiment, the second conductive layer 52 includes, for example, a metal oxide film. The metal oxide film includes, for example, at least one selected from the group consisting of indium oxide, zinc oxide, tin oxide, and ITO.

The first conductive layer 51 includes, for example, a metal thin film. The first conductive layer 51 includes, for example, a film that includes an alloy. The first conductive layer 51 may include, for example, a conductive metal oxide. For example, the first conductive layer 51 may be light-reflective. The efficiency of the photoelectric conversion of the organic semiconductor layer 30 can be increased.

An intermediate layer may be located between the organic semiconductor layer 30 and the first conductive layer 51 and/or between the organic semiconductor layer 30 and the second conductive layer 52. The intermediate layer includes, for example, PEDOT:PSS. The intermediate layer includes a polythiophene polymer.

According to the embodiment, the radiation detector may include the detection circuit 70 (referring to FIG. 1, etc.) that is electrically connected with the first and second conductive layers 51 and 52. The detection circuit 70 outputs the signal OS that corresponds to the intensity of the radiation 81 incident on the first layer 10. The sensitivity of the signal OS to beta rays is greater than the sensitivity of the signal OS to gamma rays. The ratio of the change of the signal OS to the change of the intensity of beta rays is greater than the ratio of the change of the signal OS to the change of the intensity of gamma rays. According to the embodiment, beta rays can be detected with high accuracy while suppressing the effects of gamma rays.

According to embodiments, a radiation detector can be provided in which the detection accuracy can be increased.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, first layers, organic semiconductor layers, first organic substances, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
  a first layer including a first organic substance,
    the first layer emits light based on beta rays incident on the first layer, and
    a period from a time of a maximum value of an intensity of the light until the intensity of the light drops to 1/2.72 of the maximum value is not less than 10 ns;
  a first conductive layer;
  a second conductive layer located between the first layer and the first conductive layer; and
  an organic semiconductor layer located between the first conductive layer and the second conductive layer, wherein the period is not less than 0.1 s/m and not more than 100 s/m per unit thickness of the organic semiconductor layer.

2. The detector according to claim 1, wherein
a sensitivity of a first signal generated between the first conductive layer and the second conductive layer when the beta rays are incident on the first layer is greater than a sensitivity of a second signal generated between the first conductive layer and the second conductive layer when at least one of gamma rays, neutron rays, or X-rays are incident on the first layer.

3. The detector according to claim 1, wherein
the first organic substance includes at least one selected from the group consisting of 2,4,5,6-tetra(9H-carbazole-9-yl) isophthalonitrile, 2,4,6-tris(4-(9,9-methylacridan-10-yl)phenyl)-1,3,5-triazine, 10-(4-(bis(2,3,5-tetramethylphenyl) boranyl)-2,3,5-tetramethylphenyl)-10H-phenoxazine, 2,4,6-tri (9H-carbazole-9-yl)-3,5-difluorobenzonitrile, and 9-[1,4]benzoxaborino[2,3,4-kl]phenoxaborin-7-yl-1,3,6,8-tetramethyl-9H-carbazole.

4. The detector according to claim 1, wherein
the organic semiconductor layer includes polythiophene and a fullerene derivative.

5. The detector according to claim 1, wherein
the organic semiconductor layer includes poly(3-hexylthiophene) and [6,6]-phenyl-$C_{61}$-butyric acid methyl ester.

* * * * *